US008845058B2

(12) United States Patent
Sirringhaus et al.

(10) Patent No.: US 8,845,058 B2
(45) Date of Patent: Sep. 30, 2014

(54) DISTORTION COMPENSATION FOR PRINTING (75) Inventors: Henning Sirringhaus, Cambridge (GB); James D. Watts, Ely (GB)

(73) Assignee: Plastic Logic Limited, Cambridge, Cambridgeshire (GB)

(*) Notice: Subject to any disclaimer, the term of this patent is extended or adjusted under 35 U.S.C. 154(b) by 0 days.

(21) Appl. No.: 13/563,520

(22) Filed: Jul. 31, 2012

(65) Prior Publication Data
US 2013/0027458 A1 Jan. 31, 2013

Related U.S. Application Data (62) Division of application No. 11/720,430, filed as application No. PCT/GB2005/050201 on Nov. 10, 2005, now Pat. No. 8,256,859.

(30) Foreign Application Priority Data

Nov. 29, 2004 (GB) .................................. 0426126.9
Apr. 1, 2005 (GB) .................................. 0506613.9

(51) Int. Cl.
*B41J 29/38* (2006.01)
*H04N 1/409* (2006.01)
*H05K 3/12* (2006.01)
*B41J 2/21* (2006.01)

(52) U.S. Cl.
CPC ............... *H04N 1/409* (2013.01); *H05K 3/125* (2013.01); *B41J 2/2146* (2013.01)
USPC .......................................................... 347/14

(58) Field of Classification Search
USPC .......................................................... 347/14
See application file for complete search history.

(56) References Cited

U.S. PATENT DOCUMENTS

| 5,593,236 A | 1/1997 | Bobry |
| 5,988,900 A | 11/1999 | Bobry |

(Continued)

FOREIGN PATENT DOCUMENTS

| EP | 1 433 616 | 7/2008 |
| GB | 2 134 045 | 8/1984 |

OTHER PUBLICATIONS

Zemel, et al., "X-Y Scaling Compensation Technology for Fine-Line PCB Imaging with High-Precision Alignment," Proceedings of IPC Printed Circuit Expo 2002, Long Beach, CA, S03-1-1-S03-1-5, Mar. 26-28, 2002.

(Continued)

*Primary Examiner* — Laura Martin
(74) *Attorney, Agent, or Firm* — Knobbe, Martens, Olson & Bear LLP (57) ABSTRACT A printing machine includes a substrate and at least one printhead with at least two material deposition channels which are movable with respect to the substrate, wherein the printhead is mounted on a stage which allows rotation of the printhead around an axis perpendicular to the substrate and translation in a direction perpendicular to the print direction, and wherein during each print swath, the rotation angle and translation values of the printhead are varied in order to change the pitch and the lateral position in the direction perpendicular to the print direction of material deposited from the different deposition channels; and an algorithm which computes the required rotation angles and translation values for a given pattern of substrate distortion.

10 Claims, 9 Drawing Sheets (56) References Cited

U.S. PATENT DOCUMENTS

| | | |
|---|---|---|
| 6,170,933 B1 * | 1/2001 | Nitta et al. .................... 347/42 |
| 2002/0044168 A1 * | 4/2002 | Hashi et al. .................... 347/32 |
| 2002/0105688 A1 | 8/2002 | Katagami et al. |
| 2003/0059984 A1 | 3/2003 | Sirringhaus et al. |
| 2003/0198789 A1 | 10/2003 | Koyama et al. |
| 2004/0155948 A1 * | 8/2004 | Dinca et al. .................... 347/104 |

OTHER PUBLICATIONS

International Search Report dated Mar. 30, 2006 and issued in corresponding International Application No. PCT/GB2005/050201 filed Nov. 10, 2005.

* cited by examiner

$\Delta y\ (x,y)$ x
y
Print direction

Figure 3a $\Delta x\ (x,y)$
$\Delta y\ (x,y)$

DISTORTION COMPENSATION FOR PRINTING

CROSS-REFERENCE TO RELATED APPLICATIONS

This application is a divisional of U.S. patent application Ser. No. 11/720,430, filed May 23, 2008 and incorporated in its entirety by reference herein, which is the U.S. National Phase under 35 U.S.C. §371 of International Application No. PCT/GB2005/050201, filed Nov. 10, 2005, designating the United States and published in English on Jun. 1, 2006, as WO 2006/056808, which claims priority to United Kingdom Application No. 0426126.9, filed Nov. 29, 2004 and United Kingdom Application No. 0506613.9, filed Apr. 1, 2005.

BACKGROUND OF THE INVENTION

1. Field of the Invention

This invention relates to apparatus and methods for the manufacturing of functional structures on dimensionally unstable substrates by direct-write printing techniques, in particular the manufacturing of electronic devices on flexible, plastic substrates.

2. Description of the Related Art

Integration of functional, electronic devices onto flexible substrates will potentially enable new electronic products such as flexible displays, or low-cost intelligent labels, as well as new manufacturing approaches, such as roll-to-roll manufacturing. However, many flexible substrates, such as plastic substrates, exhibit significant dimensional changes when subject to mechanical stress or temperature variations both of which occur during any manufacturing process. When a plastic substrate such as a thin sheet of polyethyleneterephtalate (PET) is heated it tends to shrink, and therefore the dimensions of any pattern which has been defined on the substrate is changing as a result of the heat exposure. Given an arbitrary reference point on such a pattern one can define an absolute distortion field, which attaches to every feature on the substrate a distortion vector equal to the difference vector of the real position of the feature on the substrate with respect to the reference point and its nominal position that was intended when the pattern was defined. The nominal position can, for example, be determined by a pattern on a photomask in the case of a lithographic patterning process, or by a software instruction file which moves the positioning stage of a materials deposition unit such as a printhead in a direct-write patterning system. For many low-cost, flexible substrates such as PET or polyethylenenaphtalate (PEN) typical absolute distortions on a substrate with dimensions of 12-14" are on the order of 50-100 µm. Such distortions cause severe problems in a manufacturing process which requires definition of multiple patterns on top of each other with good registration of the features of an upper pattern to the features of a previously defined pattern. In the case of a conventional lithographic patterning process with multiple mask levels it is very difficult to compensate for this distortion, particularly if the distortion pattern is not the same every time the process is performed, but changes when environmental conditions, process conditions, or materials properties vary.

Direct-write printing uses a materials deposition unit/printhead which can be positioned above the substrate to deliver a defined-amount of functional material into well-defined locations, and is a useful approach to manufacturing of electronic devices. This technique is capable of overcoming distortion problems because of its inherent ability to compensate for the distortion by first detecting the distortion pattern on the substrate, and then modifying the positioning instructions for the printhead in order to compensate for the distortion and deliver the material in accurate registration with any previously defined pattern on the substrate. The process of detection can either be performed by measuring the distortion pattern prior to the materials deposition step, or by detecting the local distortion and correcting for it on the fly.

Some distortion correction schemes have been described in the applicant's earlier patent application US 2003/0059984. Examples of direct-write printing techniques to which such distortion compensation schemes are applicable are, but not limited to, inkjet printing, direct-write laser patterning/ablation, or dispensing. Distortion compensation schemes can also be implemented in certain adaptive lithography techniques such as, for example, described Zemel, et al., Proceedings of Printed Circuit Expo IPC, Long Beach, Calif., Mar. 26-28, 2002.

In order to achieve high-throughput manufacturing the materials deposition unit needs to have many parallel channels. In the case of an inkjet printhead each heads comprises a large number (several 100's) of nozzles, which can be operated independently from each other, and a high-volume manufacturing inkjet printer will need to have several individual printheads mounted together. The nozzles on a printhead are typically arranged in a linear array with a well defined nozzle pitch d on the order 250 µm. For example, in order to achieve a minimum TACT, the printer should ideally be able to define an arbitrary pattern on the substrate in a single pass. In the direction perpendicular to the print direction several printheads may be mounted in order to cover the full width of the substrate.

Figure 1:
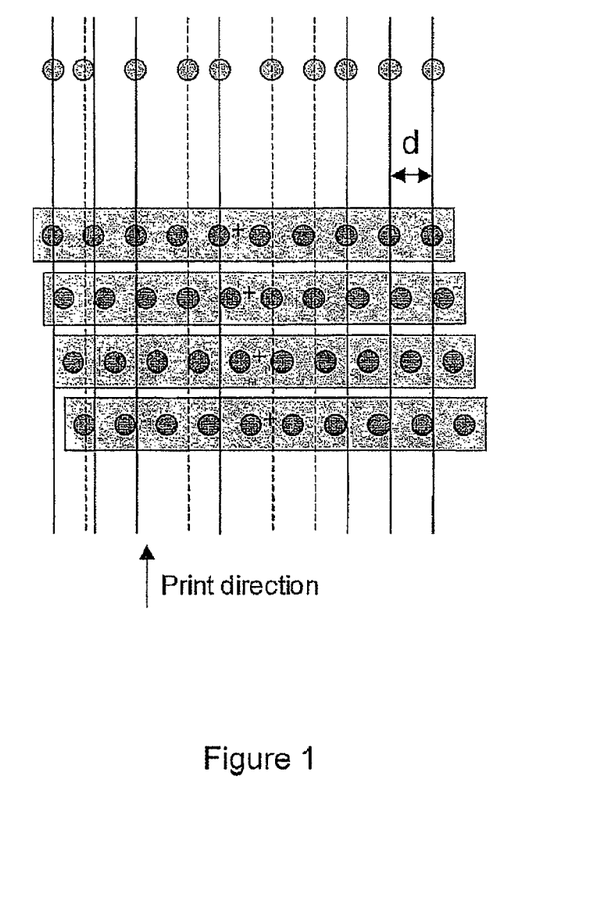
FIG. 1 illustrates a conventional distortion compensation scheme.

In such a multiple head assembly complex distortion compensation algorithms can be employed in order to ensure that an arbitrary substrate distortion can be compensated for. One scheme is illustrated in FIG. 1. N printheads are mounted behind each other each of which is shifted by a defined distance d/N perpendicular to the print direction. In the ideal case in which the substrate is undistorted and the pitch of the pattern to be printed is equal to the nozzle pitch (if the latter is not the case the head can be raked by a certain angle to achieve the desired pattern pitch), the pattern can be defined entirely by firing the nozzles of one print head only. If the substrate is distorted and the printed pattern needs to compensate for this distortion each portion of the pattern can be printed with that nozzle on a particular printhead which comes closest to the required position (FIG. 1), when moving the print head assembly along the print direction. If N is chosen such that d/N is smaller than the required registration accuracy an arbitrary distortion pattern can be compensated for in this way.

A significant drawback of this scheme is that it requires a large number of printheads, and more importantly, a large number of nozzles will not be firing regularly, but will remain idle for significant periods of time. In the case of inkjet printing, drying of the ink on the nozzle plate is a serious problem, which can cause degradation of the directionality of the droplets emitted from the nozzle, or in the worst case, nozzle blockage. In order to avoid such problems it is desirable that all nozzles are in use regularly, and that no nozzle remains idle for prolonged periods of time. In the distortion compensation scheme of FIG. 1 this requirement is difficult to meet.

It is known, from US 2002/0105688, to provide a printer with a plurality of heads, each rotatable and slidable, with control of nozzle row angle and nozzle row spacing, for fabricating an electroluminescent device. Reference is particularly made to FIG. 4 of this application and the text at paragraphs 143-147. A technique for distortion compensation in a hand-held ink jet printer is described in U.S. Pat. No. 5,593,236 and U.S. Pat. No. 5,988,900 in which, broadly speaking, rollers are used to determine a position of the print head with respect to the medium upon which the head is to print. Compensation for distortion caused by mechanical image stretch, in particular uni-directional stretch caused by transport of paper through an ink jet printer, is described in US 2004/0155948.

SUMMARY OF THE INVENTION

According to a first aspect of the present invention there is therefore provided a controller for controlling direct-write apparatus, the apparatus comprising at least one direct-write head with a plurality of direct-write channels for writing onto a substrate, at least one of said direct-write head and said substrate being moveable relative to the other in a writing direction, said head being further positionable relative to said substrate by at least rotation about an axis substantially perpendicular to said substrate at a writing position of said head; the controller comprising: a distortion data input to receive substrate distortion information characterising distortion of said substrate to be written; a distortion compensation module to determine, responsive to said distortion information, head adjustment data for controlling said head rotation to compensate for said substrate distortion; and an output to output data for controlling said printing apparatus responsive to said head adjustment data.

Preferably said direct-write apparatus comprises droplet deposition-type printing apparatus, said direct-write head with a plurality of channels comprises a droplet deposition-type print head with a plurality of nozzles, and said writing comprises printing.

Preferably the printing apparatus also enables control of print head translation in a lateral direction substantially perpendicular to the printing direction, and preferably the distortion compensation module is configured to determine print head adjustment data comprising both rotation data and translation data for the print head. In embodiments the controller is configured to control the printing apparatus in substantially real time—that is preferably the controller is configured to control the print head rotation, and preferably translation, during printing. The printing apparatus may comprise a printer in which the substrate is mounted on a print head and in which either or both of the print head and print bed are moved to effect the printing. Alternatively the printing apparatus may comprise a roll-to-roll type printing apparatus.

The substrate distortion information may comprise predetermined information, for example from a data file but preferably the substrate distortion information is determined for each substrate to be printed, and optionally on a plurality of occasions at a plurality of different printing stages. The distortion information may comprise pre-processed information such as a two-dimensional map of the substrate distortion as, say, a distorted grid or as a series of strain vectors, or it may comprise other information such as a captured image of a previously printed pattern. Such pre-processed distortion information may have been acquired by mapping the substrate to be printed on a separate distortion measurement system, or by measuring the substrate distortion on-the-fly during printing. Alternatively, the pre-processed distortion information may have been acquired on a different substrate with a distortion pattern which is similar to that of the substrate to be printed. The previously printed pattern may comprise an earlier layer of printing or a pattern of fiducial marks imposed upon the substrate. In either case a distortion map may be determined, for example, by comparing a captured image with reference (image) data.

The controller may output distortion compensation data for use by a printer driver in applying distortion compensation to data defining a pattern to be printed; alternatively the controller may receive data defining a printed pattern and output data for driving the printer in accordance with this pattern after having applied compensation for substrate distortion.

In some preferred arrangements a printer with multiple print heads is employed (so that no raster scan in a lateral perpendicular to the printing direction is needed), and in this case the controller may be configured to control the rotation and translation of the print heads together to reduce the effects of substrate distortion. In particular one or more of the print heads may be translated laterally to effect both compensation for substrate distortion and also compensation for any pixel pitch spacing changes resulting from print head rotation.

Preferably the controller is configured to compensate at least partially for pitch variations in a lateral direction (substantially perpendicular to the printing direction). Such a pitch variation may be determined or defined as a variation in pixel, line, or (droplet) dot pitch or in terms of the pitch of some other regular and/or periodic pattern. The lateral pitch distortion will generally vary in both the lateral direction and the longitudinal or printing direction and preferably, therefore, the controller is configured to compensate for pitch variations (that is distortions) of at least lateral pitch in both these directions. Preferably, therefore, the controller is configured to output data for controlling rotation of the print head (or multiple print heads) responsive to distortion information characterising lateral pitch distortion at a position of the print head on the substrate; this may comprise, for example, a centre or average position of the print head. Thus the (lateral) pitch distortion can be compensated with a granularity determined by the (lateral) dimension of a print head, substantially the same compensation being applied over this (lateral) dimension. Preferably the local (lateral) pitch distortion compensation is determined for each print head. An average pitch distortion compensation over a length in the printing direction may be applied but preferably the pitch distortion compensation is repeatedly or substantially continuously adjusted as printing progresses, that is as the print head or heads move along the printing direction.

The displacement of a print head or heads may be altered to compensate for changes in the head rotation and is preferably also adjusted (for multiple heads) to give the desired pitch at the one or more boundaries between print heads—in other words to give correct line spacing at head boundaries. Optionally one or more incremental head displacements may be applied as printing progresses, that is with motion in the printing direction, to compensate for a global (average) deviation of desired printing line directions from the actual printing direction as printing progresses.

In some preferred embodiments the controller is also configured to compensate for distortions of longitudinal pitch that is distortions of pitch in the printing direction. This may be achieved by outputting data for adjusting or controlling droplet deposition timing. This data may comprise timing signals or, in some preferred embodiments timing adjust signals such as a frequency and/or phase adjust signal or a signal specifying a division ratio for a high frequency signal which is to be divided down to derive print head drive waveforms. Separate timing or timing adjust data may be provided for each print head nozzle in such a way as to facilitate the derivation of nozzle drive signals with appropriate timing from one or a few (for example one per head) variable frequency signal generators.

In some preferred embodiments the controller includes data memory for storing the distortion data information and instruction memory storing processor implementable instructions. A data processor is coupled to the data memory to the instruction memory, to the distortion data input and to the output to load and process the instructions to implement the distortion compensation module to process the distortion information to determine the print head adjustment data and to determine and output the data controlling the printing apparatus.

In another aspect the invention provides a method of compensating for pitch distortion of a substrate onto which material is to be deposited by a printer having at least one print head with a plurality of material deposition channels, said pitch distortion comprising distortion of the pitch of a pattern with respect to which said deposited material is to be aligned, the method comprising: adjusting a rake angle of said print head during printing to compensate for said pitch distortion, said rake angle comprising an angle of said print head to a direction of said printing.

In aspects and embodiments of the invention the printing apparatus may be replaced by other direct-write apparatus and the print head and its nozzles by a direct-write head with a plurality of direct write channels, for example patterning replacing writing/deposition.

In a further aspect the invention provides a method of compensating for pitch distortion of a substrate which is to be written by a direct-write apparatus having at least one direct write head with a plurality of direct-write channels, said pitch distortion comprising distortion of the pitch of a pattern with respect to which said writing is to be aligned, writing with said direct-write channels being performed in accordance with a write drive waveform for each channel, the method comprising: moving at least one of said substrate and said head relative to the other in a writing direction during writing; and altering one or both of a frequency and a phase of each said drive waveform during said writing in response to distortion data providing information on said pitch distortion over a two-dimensional region of said substrate to compensate for pitch distortion in said writing direction.

The above described methods and controller may be implemented using computer program code on a data carrier such as a disk, programmed memory such as read-only memory (firmware) or on a data carrier such as an optical or electrical signal carrier. Embodiments of the above described controller and method may be implemented on any conventional general purpose computer system, or on a DSP (Digital Signal Processor) or on an ASIC (Applications Specific Integrated Circuit) or FPGA (Field Programmable Gate Array). Thus code (and data) to implement embodiments of the invention may comprise code in a conventional programming language such as C, or code at a lower level, or code for setting up or controlling an ASIC or FPGA, or code for a hardware description language such as Verilog (Trade mark). As the skilled person will appreciate such code and/or data may be distributed between a plurality of coupled components in communication with one another, for example on a network.

BRIEF DESCRIPTION OF THE DRAWINGS

Embodiments of the invention will now be described by way of example only with respect to the following figures in which:

FIG. 4 (A) shows droplet positions for k=0 and k=K laid on top of each other showing change of y-pitch from 176 to 179 μm; and (B) shows droplet positions for subsequent trigger pulses for m=100-97 nozzle, showing that distance between subsequent droplets varies by less than 1 μm in spite of the continuous rotation of the rake angle of the head;

DETAILED DESCRIPTION OF THE PREFERRED EMBODIMENT

Broadly, we will describe a printing machine comprising a substrate, and at least one printhead with at least two material deposition channels which are movable with respect to the substrate, wherein the printhead is mounted on a stage which allows rotation of the printhead around an axis perpendicular to the substrate and translation in a direction perpendicular to the print direction, and wherein during each print swath, the rotation angle and translation values of the printhead are varied in order to change the pitch and the lateral position in the direction perpendicular to the print direction of material deposited from the different deposition channels; and an algorithm which computes the required rotation angles and translation values for a given pattern of substrate distortion.

More particularly we will describe a distortion compensation procedure for a multiple-nozzle, multiple-head direct-write printer which enables compensation of a range of arbitrary distortions with a minimum number of printheads, and regular use of all nozzles of the assembly. The method is based on mounting each printhead on a rotation-translation stage and adjusting both the rake angle of each head, and the lateral position of each head in the direction perpendicular to the print direction continuously during the printing step in order to compensate for the distortion of a pattern on the substrate with respect to which the printed material deposits need to be aligned accurately.

Figure 2:
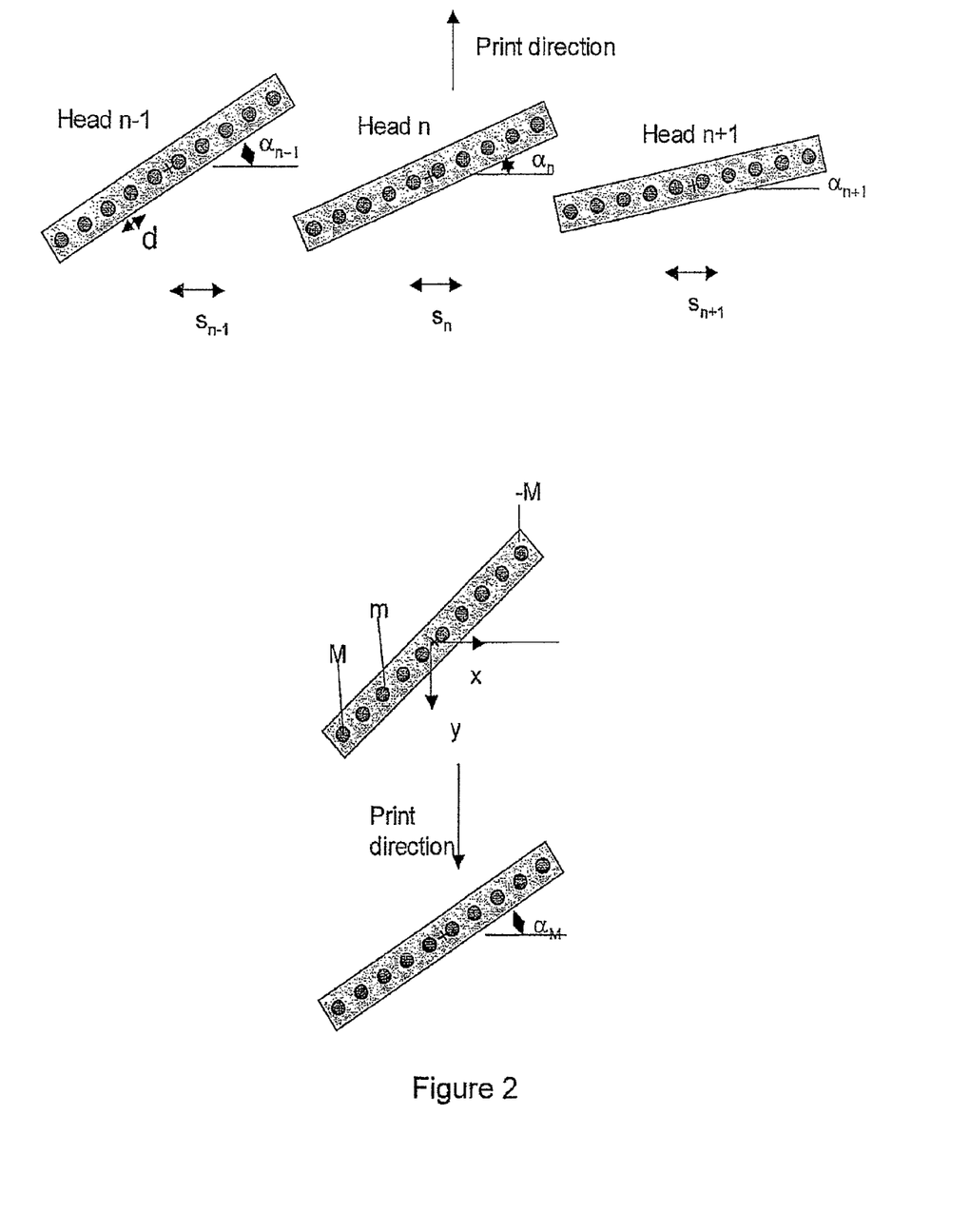
FIG. 2 illustrates an embodiment of a distortion compensation scheme according to the present invention.

According to an embodiment of one aspect of the invention there is provided a method in which a distortion of the pitch in the y-direction $\Delta y(x,y)$ of a periodic pattern is compensated for x being along the printing direction. The printer unit is designed such that several printheads are arranged in an essentially linear fashion to cover a certain swath width in the y-direction perpendicular to the print direction. Preferably, the swath width is equal to or larger than the width of the substrate such that the pattern can be printed in a single pass. Each printhead of the N printheads is mounted on a mechanical positioning stage which allows the $n^{th}$ printhead (a) to be rotated independently, preferably by an arbitrary rake angle $\alpha_n$ (at least over a range of angles), and (b) to be translated independently perpendicular to the print direction by a distance $s_n$ (FIG. 2). In addition, in embodiments the positioning stage can allow other motions of the printhead such as adjustment of the vertical print distance between the nozzle plate and the substrate plan or the lateral position of the printhead along the print direction. The rake angle $\alpha_n$ of each head and the y-position of each head is preferably continuously adjusted in substantially real time during the printing to match the local y-pitch perpendicular to the print direction.

Figure 3A:
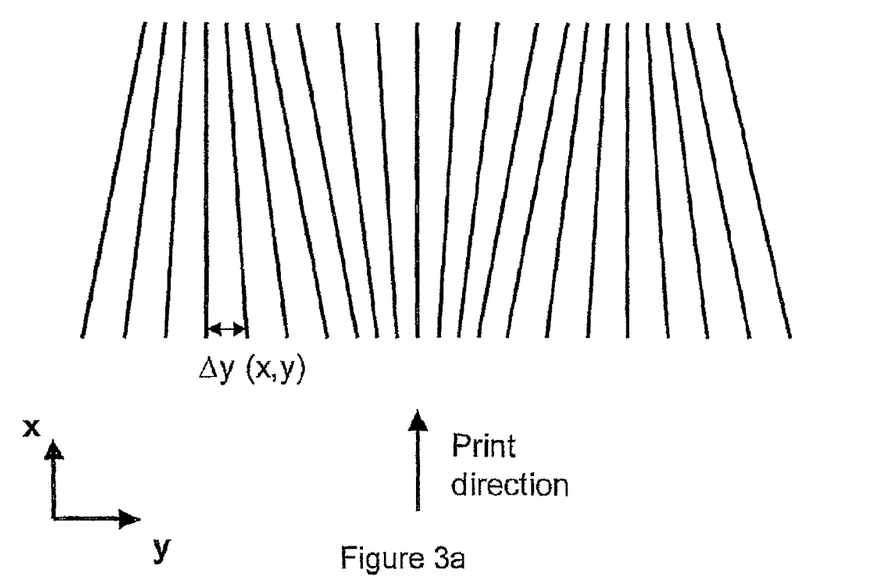
FIG. 3 illustrates different distorted patterns to be printed: (A) a pattern of continuous lines with variable line pitch across the substrate; (B) a pattern of islands with variable pitch in both an x and y direction.

Consider a pattern of quasiparallel lines to be printed (FIG. 3A). In the absence of distortion the rake angle of all heads would be the same, and assuming that the lines are parallel to the print direction would be set such that $d \cdot \cos \alpha = \Delta y = $ constant. The nozzles are firing continuously and the print speed and firing frequency of the nozzles are adjusted so as to obtain a continuous line deposit of material on the substrate. In some case the lines may be printed in multiple passes by filling in gaps left in previous passes. This may be necessary if the wetting conditions on the substrate are such, that continuous line deposits cannot be fabricated in a single pass. However, if the underlying pattern on the substrate is distorted the local pitch $\Delta y(x,y)$ between neighbouring lines should vary smoothly over the substrate in order to provide accurate registration with the distorted substrate pattern. Such a situation arises for example when printing the conducting gate or data interconnects on an active matrix display, where thin film transistors (TFT) are located on each pixel of the display. All the transistor gates in one row are connected by a straight high-conductivity gate interconnect line. The position of each of the gate electrodes needs to overlap with the channel of the TFT defined by the pattern of source-drain electrodes that was predefined on the substrate. If the substrate distorts in between the source-drain and gate patterning step, the pitch between two gate interconnecting lines should be adjusted both in the direction perpendicular to the print direction, and also along the print direction. In many practical situations the variation of the local pitch over the length scale of one single printhead is negligible, i.e. can be neglected compared to the required tolerance for gate positioning (see distortion data below), but becomes significant over larger distances.

At the beginning of each swath each printhead is set to a different rake angle taking into account variations of the line pitch over the full swath width. Preferably, the print direction is chosen to be along the direction of the lines. The rake angles $\alpha_n$ are initially adjusted such that each printhead matches the local line pitch at the edge of the substrate (x=0):

$$d \cdot \cos \alpha_n(x=0) = \Delta y(0, y_n) \quad (1)$$

where $y_n$ is the y-position of the center of the n-$^{th}$ printhead, and $\Delta y(0, y_n)$ is the y-pitch of the pattern to be printed averaged over the region which the $n^{th}$ printhead is covering at the beginning of the print swath (x=0).

During each print swath the rake angles $\alpha_n$ and translation values $y_n$ are continuously adjusted as the printhead assembly is moving along the print direction to adjust for the variations of the line pitch along the print direction:

$$d \cdot \cos \alpha_n(x_n) = \Delta y(x_n, y_n) \quad (2)$$

where $\Delta y(x_n, y_n)$ is the y-pitch of the pattern to be printed averaged over the region which the $n^{th}$ printhead is covering at a position $x_n$ of the print swath.

Simultaneously, the translation stage(s) in the y-direction are used to shift each printhead by an amount $s_n$ in the y-direction aiming to ensure that the array of lines printed by the assembly of printheads is in the correct position with respect to the underlying pattern on the substrate perpendicular to the print direction. This can be achieved by a range of techniques.

For example, for each set of rake angles the values of $s_n$ can be chosen such that the distance between the last, $M^{th}$ nozzle of the n-$1^{th}$ head to the first, $-M^{th}$ nozzle of the $n^{th}$ head projected on the y-direction (FIG. 2B) matches the local pitch $\Delta y$ ($x_n, (y_{n+1} + y_n)/2$) at the edge between the two printheads during printing. Other techniques can also be used as well. Note that any adjustment in rake angles during the swath should be accompanied with an adjustment of $s_n$.

By adjusting the values of $s_n$ continuously (with motion in the print direction) it is also possible to adjust for deviations of the direction of the lines from the print direction. This might arise if the array of lines makes an angle $\beta$ with the print direction, either because of initial misalignment of the substrate or because of a distortion of the substrate which requires the direction of the lines to change across the substrate without necessarily requiring an adjustment of line pitch. In this case, all printheads are continuously adjusted by the same amount such that $ds_n/dt = v \cdot \tan \beta$, where t is the time; in embodiments this can be a result of using the previously described method. If $\beta$ is constant across the substrate $s_n = v \cdot \tan \beta \cdot t + s_n(t=0)$ independent of n. Note that this overall translation of the values of $s_n$ can be superimposed onto any relative adjustments of the values of $s_n$ to compensate for any variation of $\Delta y(x_n, y_n)$ over the width of the print swath. If $\beta$ varies in a complex manner across the substrate $s_n(t)$ follows a more complex solution of the differential equation, and can also depend explicitly on n.

In this way it is possible to print an array of quasi-parallel lines with arbitrary variation of line pitch along the print direction, and with a variation of line pitch perpendicular to the print direction as long as the latter is sufficiently small on the length scale of one of the printheads, i.e. that the variation of $\Delta y$ on the length scale of one printhead is smaller than the registration accuracy which needs to be achieved. This is in fact satisfied for many practical flexible substrates, including low-temperature plastic substrates, such as heat-stabilized PET and PEN as long as the maximum process temperature does not exceed values on the order of 150-200° C. Compared to the distortion compensation scheme of the prior art our method has the advantage that no additional printheads are required to implement the distortion compensation, and essentially all nozzles are firing continuously.

One desirable feature for this technique is to ensure that even for the two outermost nozzles of each head which experience the largest rotational motion as the rake angles are adjusted continuously the distance between two subsequently fired droplets along the same line does not significantly change. Otherwise, there can be a risk of breaks in the line arising if the distance between neighbouring droplets exceeds a critical value.

FIG. 4 shows simulations of the droplet positions for a particular printhead for different phases k of the trigger signal. For this simulation we made the following typical assumptions:

Substrate size: 1 m$^2$ substrate
Print speed v=1 m/s
Nozzle pitch d=250 µm
Firing frequency f=32 kHz: This implies that for the $0^{th}$ nozzle at the center of the printhead the x-position on the substrate of the droplets fired by the $k^{th}$ trigger pulse of the nozzle is equal to $k \cdot L_x = k \cdot v/f = k \cdot 31.25$ µm.

Assume local substrate y-pitch changes by 1% from one end of the substrate to the other end, for example from 176.8 µm near one edge x=0 ($\alpha_0 = 45°$) to 179.3 µm near the other edge x=1 m ($\alpha_K = 44.2°$).

For simplicity pitch for firing the $k_{th}$ droplet is assumed to change linearly, i.e, $\alpha_k = \alpha_0 + (\alpha_K - \alpha_0) \cdot m/N$, where K=32000

Under these assumptions we obtain for the position (in μm) of the $k^{th}$ droplet from the m-th nozzle:

$$(x_k, y_k)_m = (m \cdot 250 \cdot \sin(\alpha_k) + k \cdot L_x, m \cdot 250 \cdot \cos(\alpha_k)) \quad (3)$$

Figure 4A:
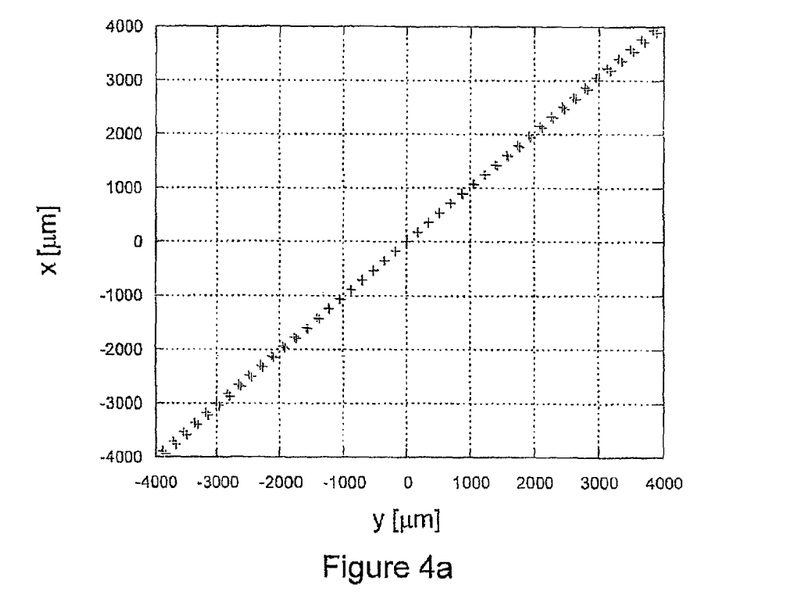
Figure 4B:
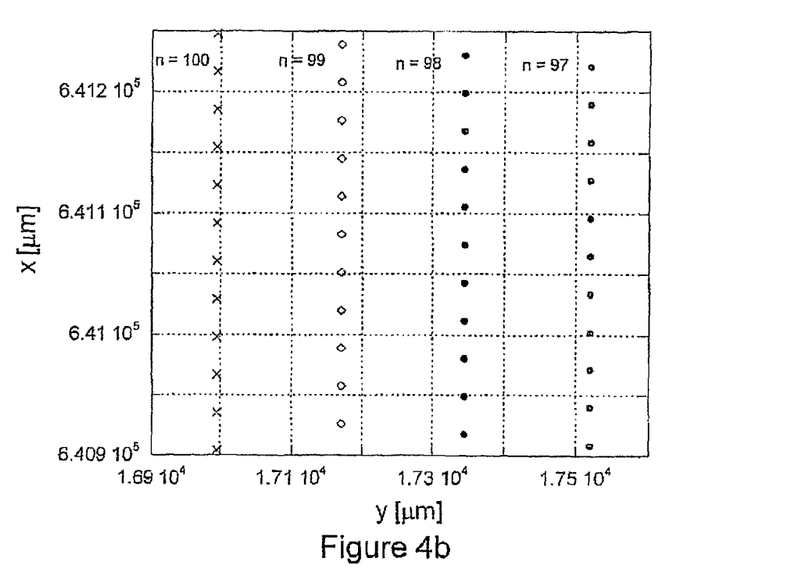

FIG. 4(A) shows the droplet positions for k=0 and k=M laid on top of each other showing change of y-pitch from 176 to 179 μm. FIG. 4(B) shows the droplet positions for the m=100-97 nozzles for subsequently printed droplets, showing that the distance between subsequent droplets varies by less than 1 μm as the rake angle is smoothly varied during the pass.

An important component of any distortion compensation scheme is the efficient measurement and detection of the distortion either during a pre-patterning distortion mapping step, or in-flight during the patterning. It is not necessary to measure the distortion of any feature of the pattern, but only on the length scale over which the uncertainty in position due to distortion becomes larger than the required relative alignment and registration accuracy. In the following we describe a particular embodiment for the efficient measurement of the distortion pattern and the calculation of the print positions which are required to compensate for the distortion.

The substrate is a regular arrayed pattern for an active area display back plane formed on the plastic substrate. It has 60×80 pixels with a resolution of 50 dpi, i.e. the pixel pitch is 500 μm. This nominal pattern is assumed to be dimensionally precise as it is defined by a pattern on a photomask which is transferred onto the substrate by photolithography.

Figure 5:
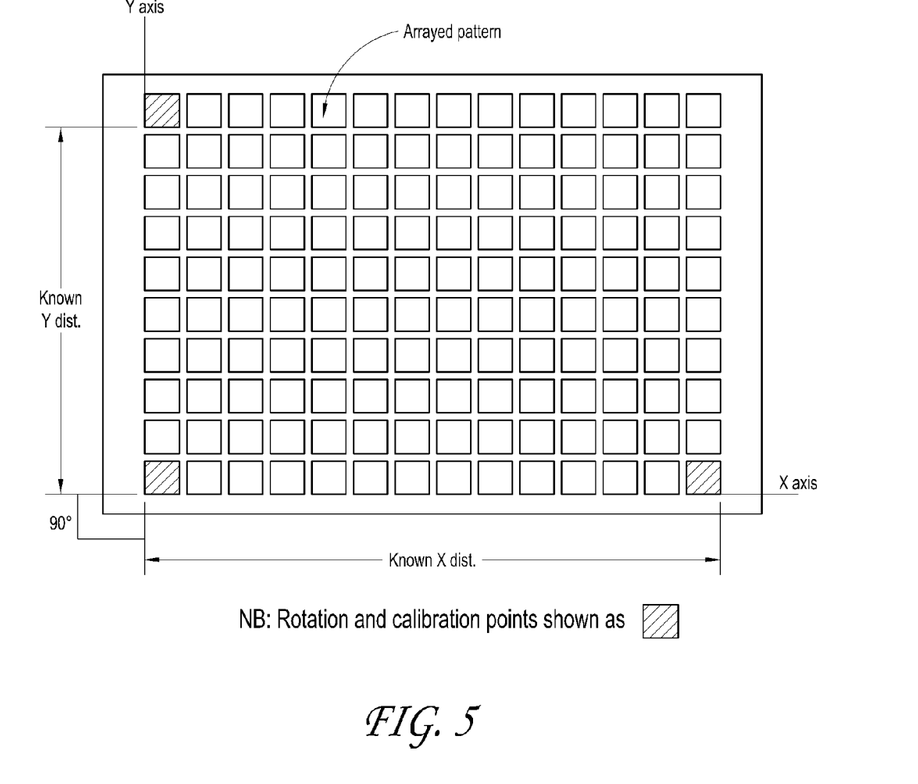
FIG. 5 shows a schematic diagram of an example of a calibration pattern for a method to measure distortions on a flexible substrate.

Three alignment marks/rotation & calibration points at the corners of the pattern are used to calculate the sample rotation (with respect to the machine/stages) and simple linear calibration factors in the X and Y axes, see FIG. 5. The calibration factors are calculated by inputting the known dimensions for these axes, taken from the photolithography mask dimensions and comparing these to the actual positions for the three corner points. The print direction is chosen to be the direction defined by the two alignment marks along the x-axis, or alternatively the y-direction.

Once the panel (substrate) is rotated and calibrated we move the positioning stages to designated locations (taken from the mask drawings) to view the location of the pattern. In this case we measure every $10^{th}$ feature along a particular direction. On a substrate with higher (smaller) distortions, a larger (smaller) number of features are used. Using high magnification optics and graticule we measure the offset between expected pattern positions against actual positions, thus creating a map of the distortion of the panel. Automated pattern recognition techniques may be employed. Note that the data is not the absolute distortion of the substrate since it includes the initial calibration constants for the X and Y axes.

Samples containing arrayed source-drain patterns with pitches of 500 microns of 80-columns by 60-rows have been measured (hence known X=39,500 μm and known Y=29,500 μm).

Figure 6A:
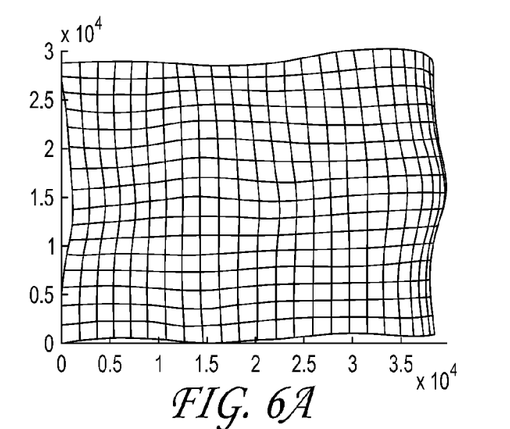
FIG. 6 shows plots of measured distortion on a 60×80, 50 dpi active matrix substrate on PET.
Figure 6B:
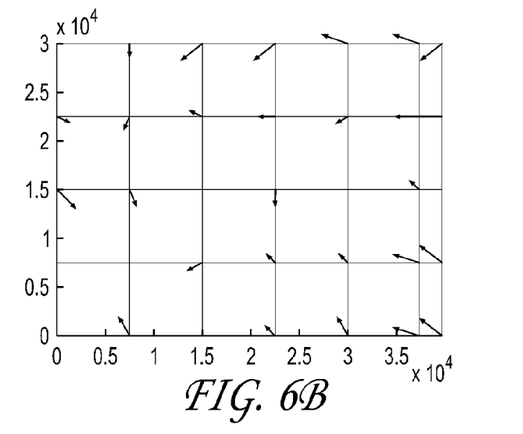
Figure 6C:
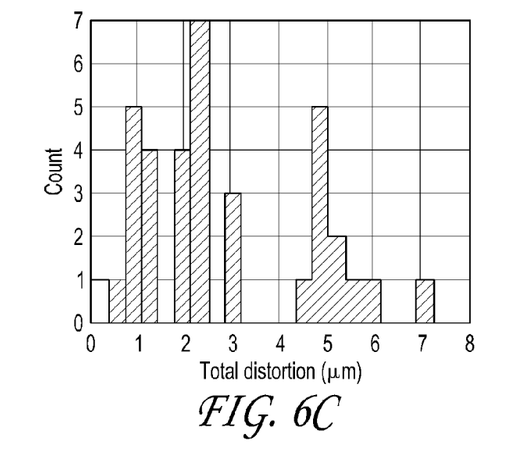

FIG. 6A shows a mesh plot of the X and Y positions of the patterns with the distortions magnified by a factor of 300. FIG. 6B shows this data in the form of a quiver plot. The arrows represent the magnitude and direction of the distortion of a particular pixel with respect to its nominal position. The length of each arrow is multiplied by a factor of 300. FIG. 6C is a histogram representation of the frequency of the absolute distortion. The plastic PET substrate exhibits maximum distortion of about 7 μm on a length scale of about 2". Examining FIG. 6B closely we note that the length of the arrows increase towards the top right corner of the patterned area, implying that there must be a linear distortion component present in the measurement.

The measurement data shown here for a PET substrate shows clearly that the distortion of the substrate on the length scale of the printhead (2") is comparable to the droplet placement accuracy which can be achieved with a technique such as inkjet printing. This means that with typical process conditions for PET it is not necessary to compensate for variations of $\Delta y(x_n, y_n)$ over the width of the printhead, at least as long as the substrate process temperature is kept below 150° C., and the substrate is heat-stabilized with the help of a pre-processing temperature anneal during which most of the substrate shrinkage can be made to occur before beginning the processing of the patterned layers.

Figure 7A:
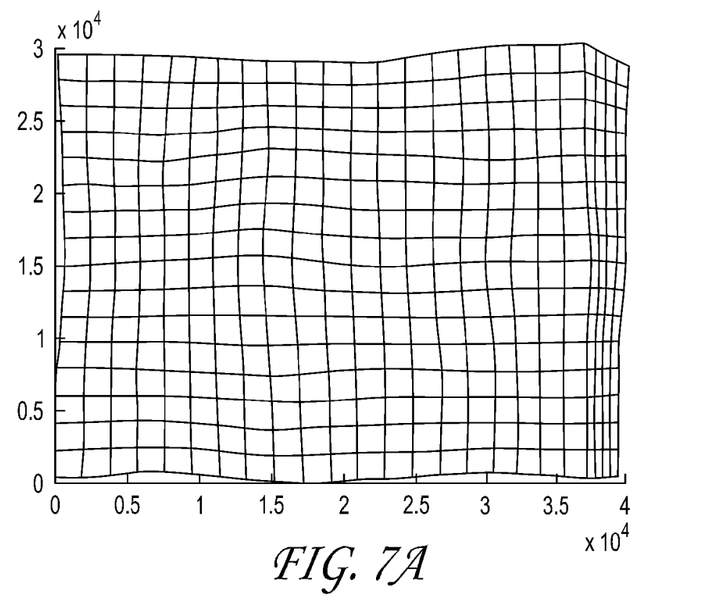
FIG. 7 shows plots of the distortion of FIG. 6 after correcting each row of pixels for an average distortion in the y-direction.
Figure 7B:
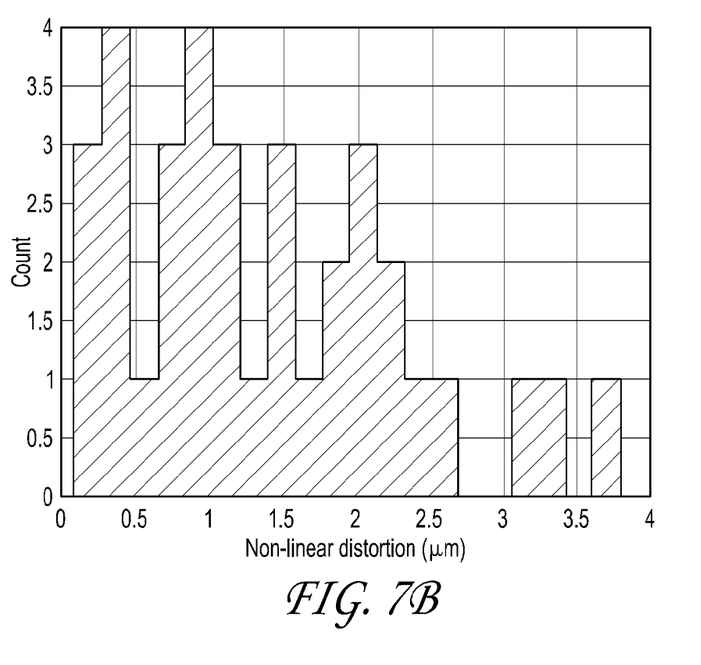

A simple example algorithm to determine the optimum y-position for the printed gate lines is to average the y-position of all measured pixels in each row along the print (x) direction, or over some distance along the x-direction over which the head rake angle is effectively kept constant. We illustrate this method here first for single nozzle printing. The gate lines are printed at a y-position that corresponds to the average y-position of pixels in a particular row. In this way the magnitude of the distortion can be reduced significantly. FIG. 7A shows a mesh plot for the distortion data adjusted for the average y-distortion in each row, and FIG. 7B shows the respective histogram. Note that the overall distortion values are now reduced to below 4 μm. This technique may be employed after mapping a substrate to create corrected electronic data files, to improve the resolution of the direct-write process on plastic substrates.

The method can be extended to multiple nozzle printing. For multiple nozzle printing the set of average y-positions of the pixels in each row averaged over a certain distance along the print direction are used to calculate the average pitch, and rake angle of the printhead as well as the optimum y-position of the centre of the printhead as described above.

Figure 3B:
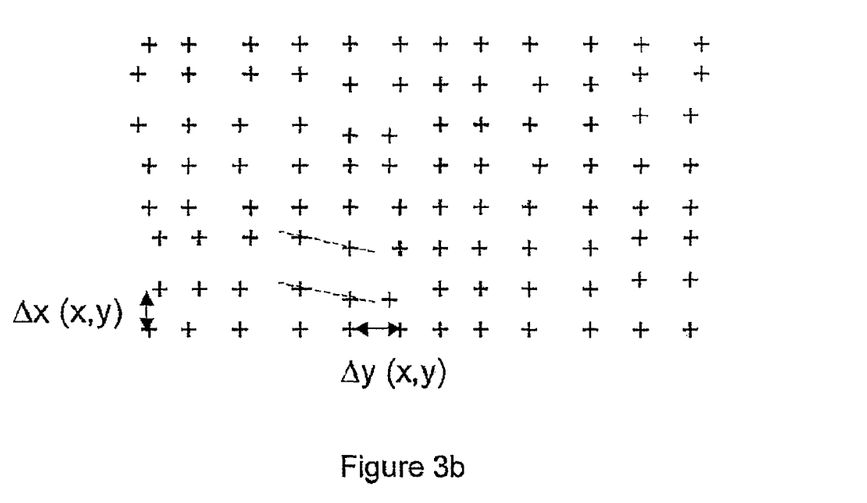

We now describe a method by which distortions of the x-pitch both along the print direction as well as perpendicular to the print direction can also be compensated for. This is helpful for the somewhat more complicated case where a two-dimensional periodic pattern needs to be printed that has a well defined pitch $\Delta y$ perpendicular to the print direction, but also a pitch $\Delta x$ along the print direction (FIG. 3(B)). Such a situation arises, for example, for the definition of the semiconducting active layer island of the TFT on an active matrix display. This pattern nominally comprises a rectangular or quadratic grid where semiconducting material needs to be deposited in the form of an active layer island on each node of the grid. In this example each island should be isolated from and not connected with neighbouring active layer islands/nodes. In this case the print direction can be chosen along one of the edges of the grid, defined to be the x-direction. As above the technique of adjusting rake angles and translation vectors for each printhead independently can be used to adjust to variations of the local y-pitch $\Delta y(x_n, y_n)$ in both the print direction as well as perpendicular to the print direction.

To compensate for the variations of the pitch $\Delta x(x_n, y_n)$ across the substrate several methods can be employed. One is to use a printhead each nozzle of which can receive an independent, arbitrary waveform trigger signal to fire droplets at any desired position. In this method rake angles and translation vectors for each printhead are adjusted to match the local y-pitch $\Delta y(x_n, y_n)$, and independent trigger waveforms are applied to each nozzle on each head to ensure that each droplet is fired at the right time to land in the correct location of the distorted pattern along the print direction. This method is capable for correcting for an arbitrary distortion $\Delta x(x_n, y_n)$. However, one disadvantage of this method that it uses relatively complex driver electronics, which can apply independent trigger signals to each nozzle. Also it puts some constraints on the design of the printhead itself, since in some designs where neighbouring nozzles share part of the actuator mechanism there is crosstalk between neighbouring nozzles, such that they cannot be fired at an arbitrary time difference with respect to each other.

Figure 8A:
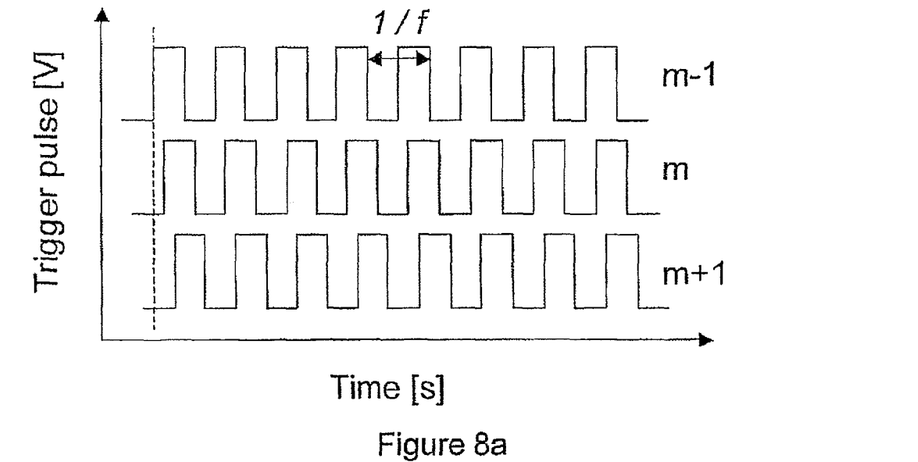
FIG. 8 shows example signal waveforms for triggering of neighbouring nozzles in order to compensate for distortion of the pitch along the print direction.

A simplified alternative scheme is to use the same firing frequency f for all nozzles on a particular head, but to make the phase of the trigger signal to be independently adjustable for each nozzle during each swath (see FIG. 8A). The frequency f is adjusted such that $\Delta x(x_n,y_n)=v/f$, and needs to be variable during each swath to compensate for variations of $\Delta x(x_n,y_n)$ along x. For example, by changing the firing frequency from 32 kHz to 31 kHz the local distance $\Delta x$ between two neighbouring/subsequently fired droplets can be changed by 1 micron for a stage speed of 1 m/s (from 31.2 to 32.2 microns). Each printhead can have a different frequency to compensate for variations of $\Delta x(x,y)$ along y. The phase of the trigger signal applied to each nozzle is preferably adjusted independently. This is to ensure that for a given rake angle of the head set to match the local $\Delta y(x_n,y_n)$ pitch each nozzle is fired at the correct time for the droplet to land in the correct position in the unit cell/pixel. Note that simultaneously fired droplets generally only land in the correct position for a number of discrete values of the rake angle (since this affects the x-spacing pixel/drop pitch). Since in the distortion scheme proposed here, the rake angle is varied to match the local y-pitch of the pattern, it may often not be possible to fire the droplets simultaneously if one wants to ensure that they land in the correct position of the unit cell/pixel.

Compared to using complete waveforms for each nozzle this method requires less complex driver electronics. In embodiments it uses a programmable phase shift circuit at the input to each nozzle, as well as a tunable frequency generator for the trigger signal of each printhead. The phase signal applied to each nozzle is determined on the basis of the distortion map which has been acquired either prior to the print step, or is being acquired in flight during the printing. The method of variable phase shift preferably allows firing all nozzles at the maximum frequency compatible with the mechanical design of the printhead, and therefore enables a high throughput.

Figure 8B:
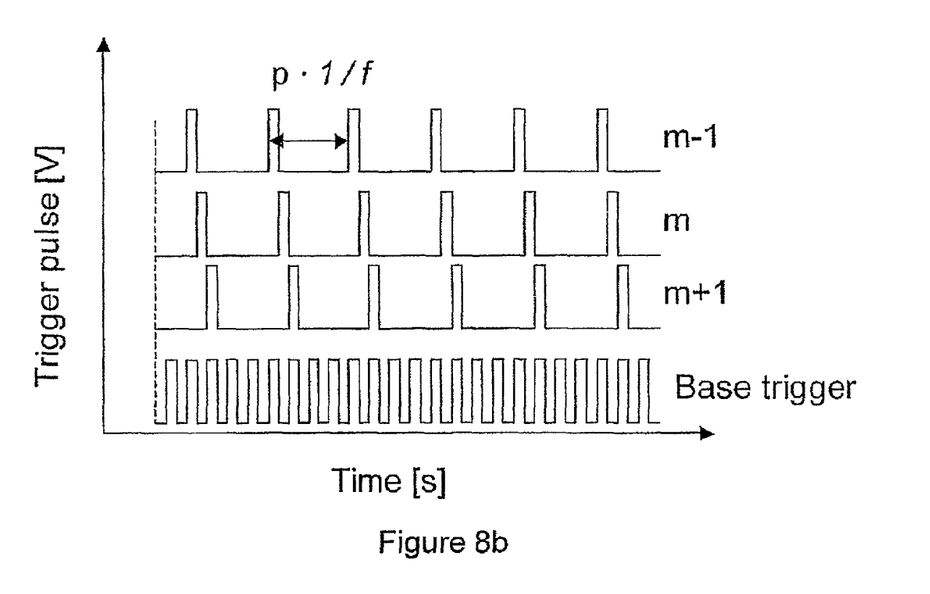

A further alternative method for compensation of distortion of the x-pitch is to use a base trigger signal at a high frequency and a fixed phase common to all nozzles of a particular head, but fire each nozzle only at each p-th cycle of the base trigger signal (see FIG. 8B), such that $\Delta x(x_n,y_n)=p\cdot v/f$. Each nozzle can be fired at a different cycle of the base trigger signal to aim to ensure the correct position of each droplet in the unit cell/pixel. In this method it is even possible to compensate for variations of $\Delta x(x_n,y_n)$ on the length scale of the printhead by choosing different values division ratio of p for the different nozzles of a printhead. To compensate for variation of $\Delta x(x_n,y_n)$ along the print direction either p or f can be varied. To compensate for longer scale variation of $\Delta x(x_n,y_n)$ perpendicular to the print direction it is desirable that p and/or f can be different for different printheads.

Figure 9:
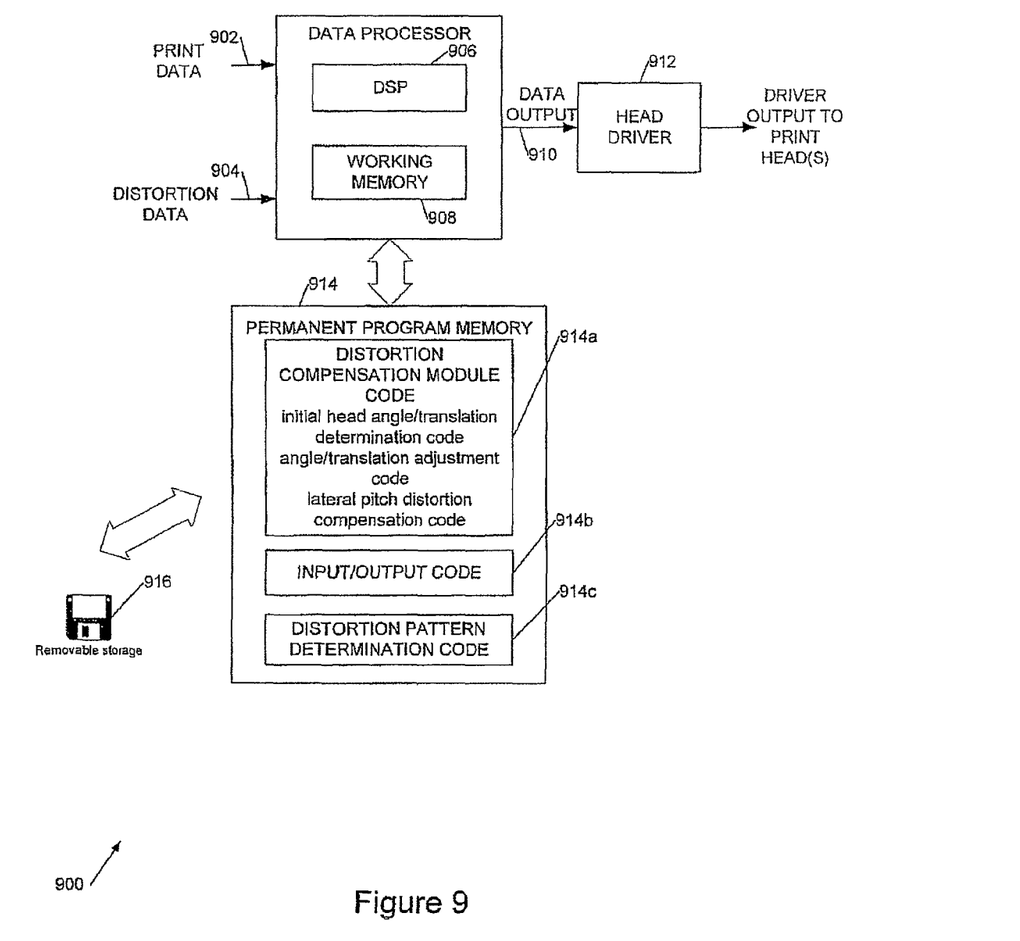
FIG. 9 shows an example of a controller configured to implement methods according to embodiments of aspects of the invention.

FIG. 9 shows an example of a printer controller 900 configured to implement the above described methods.

In FIG. 9 a data processing system comprises a digital signal processor 906 coupled to working memory 908 and having a print data input 902 to receive data defining a pattern to be printed, and a distortion data input 904 to receive distortion data, for example, determined as described above either manually or, preferably, automatically by means of an image capture and processing system. A data output 910 is provided to a head driver system 912 which provides output waveforms, for example, of the type shown in FIG. 8, to one or more multiple nozzle droplet deposition type print heads. The data processing system is also coupled to permanent program memory 914 such as flashram or rom. Memory 914 stores processor control codes for controlling DSP 906 to implement the above described distortion compensation, methods. In particular memory 914 stores distortion compensation module code 914a comprising initial head angle/translation determination code, head angle/translation adjustment code (for angle/translation adjustment during printing), and lateral pitch distortion compensation code; input/output code 914b; and (optionally) distortion pattern determination code 914c for determining and/or modifying distortion pattern data. For example, this latter code may operate on the print data to derive modified print data (and modified distortion data) requiring reduced distortion compensation, as outlined above.

Optionally some or all of the code stored in permanent program memory 914 may be provided on a removable storage medium illustratively shown by floppy disk 916.

The invention is applicable to a range of printing applications on distorted substrates. Examples include, but are not limited to:

Inkjet of an array of metallic lines on a distorted substrate using a nanoparticle metal or a precursor metal ink, or using a printable catalyst in combination with an electroless plating process.

Inkjet printing of conducting, semiconducting, dielectric polymer patterns for fabrication of an active or passive matrix display array, such as a TFT array for an active matrix electrophoretic or liquid crystal display, or an array of light-emitting diodes for an emissive display or an array of photo-diodes for an image sensor device.

Graphic arts printing applications which require accurate registration of different materials on a distorted substrate.

Embodiments of the invention are also applicable to other direct-write patterning techniques which are not based on direct-write materials deposition. The technique is applicable in an entirely analogous way, for example, to direct-write laser patterning using a laser patterning head comprising at least two focussed laser beams. Such focussed beams may be generated, for example, by passing laser light to a suitable photomask which forms a light pattern when projected onto the substrate, or alternatively by using a digital mirror device or other light valve technology. Each beam may be turned on and off digitally by applying a control signal. The laser patterning head is moved relative to the substrate along a patterning direction. In this way a light exposure pattern on the substrate is generated that is analogous to the pattern of material defined by the materials deposition unit above, and embodiments of techniques according to the present invention compensating for the distortion of an underlying pattern can be applied analogously. Each laser beam modifies the properties of at least one layer of the substrate upon exposure, for example, by removing material from the substrate by laser ablation, or by inducing a photochemical reaction of said layer. This change in the properties of said layer is used to define a pattern on the substrate. In a preferred embodiment said pattern is defined by direct-write laser ablation.

In this case a patterning controller comprises at least one direct-write patterning head with a plurality of patterning channels for patterning of a layer on a substrate, wherein said substrate (or said head) is moveable in a patterning direction, said patterning head being positionable relative to said substrate by at least rotation about an axis substantially perpendicular to said substrate at a patterning position of said head; the controller comprising: a distortion data input to receive substrate distortion information characterising distortion of said substrate to be patterned; a distortion compensation module to determine, responsive to said distortion information, patterning head adjustment data for controlling said patterning head rotation, preferably during patterning, to compensate for said substrate distortion; and an output to output data for controlling said patterning apparatus responsive to said patterning head adjustment data.

The technique is similarly applicable to non-periodic patterns such as the circuit patterns in a logic circuit on a flexible substrate or on a printed circuit board. The same technique of adjusting the rake angle and lateral position of each head can be used in this case to adjust for the local distortion of a previously defined pattern in the y-direction perpendicular to the print direction.

The specific algorithms described above for adjusting the values of $\alpha_n$ and $s_n$ during the print swath provide a specific embodiment of the invention. However, a person skilled in the art that using the printhead assembly described here other algorithms for correcting the substrate distortion can be used.

The present invention is not limited to the foregoing examples. Aspects of the present invention include all novel and/or inventive aspects of the concepts described herein and all novel and/or inventive combinations of the features described herein. The invention might also be used in combination with conventional distortion compensation techniques, such as the technique described above of using a large number of heads to effectively create a grid much smaller than the nozzle pitch.

The applicant draws attention to the fact that the present inventions may include any feature or combination of features disclosed herein either implicitly or explicitly or any generalisation thereof, without limitation to the scope of any definitions set out above. In view of the foregoing description it will be evident to a person skilled in the art that various modifications may be made within the scope of the inventions.

What is claimed is:

1. A method of compensating for pitch distortion of a substrate onto which material is to be deposited by a printer having at least one print head with a plurality of material deposition channels, said pitch distortion comprising distortion of the pitch of a pattern on said substrate with respect to which said deposited material is to be aligned, the method comprising:

printing material on said patterned substrate; and during said printing step, continuously adjusting a rake angle of said print head to compensate for said pitch distortion, said rake angle comprising an angle of said print head to a direction of said printing.

2. A method as claimed in claim 1 further comprising adjusting a lateral position of said print head in combination with said rake angle adjusting during said printing to compensate for said pitch distortion, said lateral position comprising a position of said print head along a direction substantially perpendicular to said printing direction.

3. A method as claimed in claim 1 further comprising inputting distortion data for said substrate, said distortion data providing information on said pitch distortion over a two-dimensional region of said substrate, and wherein said adjusting is performed responsive to said pitch distortion information.

4. A method as claimed in claim 3 further comprising processing said pitch distortion information prior to said adjusting to reduce a degree of said adjusting.

5. A method as claimed in claim 3 wherein said rake adjusting is responsive to a pitch distortion at a position of said print head.

6. A method as claimed in claim 1 wherein said printer has a plurality of said print heads, and wherein said adjusting comprises adjusting rake angles of said plurality of print heads, the method further comprising adjusting one or more spacings between said print heads in combination with said adjusting of rake angles to compensate for said pitch distortion.

7. A method as claimed in claim 1 further comprising altering a timing of said printing to compensate for pitch distortion along said direction of printing.

8. A method as claimed in claim 7 wherein said printing with said material deposition channels is performed in accordance with a print drive waveform for each channel, and wherein the method further comprises altering one or both of a frequency and a phase of each said drive waveform during printing.

9. A carrier carrying computer program code to, when running, implement the method of claim 1.

10. A printer controller including the carrier of claim 9.

* * * * *